United States Patent [19]
Kiesewetter

[11] Patent Number: 5,414,397
[45] Date of Patent: May 9, 1995

[54] CLAMPING DEVICE FOR MAGNETOSTRICTIVE BODIES

[75] Inventor: Lothar E. Kiesewetter, Berlin, Germany

[73] Assignee: Dynamotive Corp., Vancouver, Canada

[21] Appl. No.: 983,566

[22] PCT Filed: Aug. 8, 1990

[86] PCT No.: PCT/EP90/01294
§ 371 Date: Apr. 7, 1993
§ 102(e) Date: Apr. 7, 1993

[87] PCT Pub. No.: WO92/02962
PCT Pub. Date: Feb. 20, 1992

[51] Int. Cl.⁶ .................. H01F 7/00; H01L 41/06; G01N 29/00; G01H 1/00
[52] U.S. Cl. .................. 335/215; 310/26; 73/668; 73/576; 367/168; 367/156; 381/190
[58] Field of Search .......... 310/26; 335/215; 73/576, 578, 570, 668; 367/140, 168, 156; 381/190

[56] References Cited
U.S. PATENT DOCUMENTS

| | | | |
|---|---|---|---|
| 1,750,124 | 3/1930 | Pierce | 310/26 |
| 1,882,400 | 10/1932 | Pierce | 310/26 |
| 2,506,141 | 5/1950 | Drouin | 318/118 |
| 2,843,974 | 7/1958 | Butterworth | 51/103 |
| 4,432,080 | 2/1984 | Wardle | 367/163 |
| 5,020,036 | 5/1991 | Petermann | 367/168 |
| 5,039,894 | 8/1991 | Teter | 310/26 |
| 5,281,875 | 1/1994 | Kiesewetter | 310/26 |
| 5,317,223 | 5/1994 | Kiesewetter | 310/26 |

FOREIGN PATENT DOCUMENTS

| | | |
|---|---|---|
| 0358534 | 3/1990 | European Pat. Off. |
| 3904269 | 8/1990 | Germany |
| WO88/05618 | 7/1988 | WIPO |

OTHER PUBLICATIONS

"The AIL Inchworm Motor", Airborne Instruments Laboratory, Advertisement, Proceedings of the IRE, Aug. 1957.

*Primary Examiner*—Leo P. Picard
*Assistant Examiner*—Stephen T. Ryan
*Attorney, Agent, or Firm*—Shlesinger Arkwright & Garvey

[57] ABSTRACT

The invention relates to an elastic clamping device for at least one body with magnetostrictive properties, wherein a pressure force presses the clamping device against the inner magnetostrictive body with a predetermined force. The pressure force extends in the direction of contraction and perpendicular to the direction of expansion both caused by the influence of a magnetic field on the magnetostrictive body and results in a prestress acting in the direction of contraction in the magnetostrictive body. The predetermined pressure from the pressure force exerted on the clamping device and thus on the magnetostrictive body is adjustable by means of a resilient force or mechanical setting device.

8 Claims, 3 Drawing Sheets

PRIOR ART

CLAMPING DEVICE FOR MAGNETOSTRICTIVE BODIES

The invention relates to an elastic clamping device for use in linear motors and actuators where a pressure means presses the clamping device with a predetermined force against a body having magnetostrictive properties located on the inside.

Magnetostrictive bodies change their geometry under the influence of a magnetic field. A rod, for example, becomes thinner and longer. Such rod may be used as an advancing element. In the art of linear motors or actuators using magnetostrictive bodies, various mechanisms and methods have been employed to utilize the change in the geometry of such bodies under the influence of a magnetic field. In patent application SE 8700219-2, dated Jan. 21, 1987 (PCT/SE88/00010, dated Jan. 19, 1988), a linear motor is described in which a magnetostrictive rod is kept within a stator tube surrounding it with a press fit. The amount of the press fit, which is dependent on the tolerance between the rod and stator tube, determines the frictional force between the inner surface of the stator tube and the outer surface of the magnetostrictive rod, and consequently, determines the output force of the linear motor. The rod moves within the tube in a worm-like manner by being exposed to a magnetic field travelling in the longitudinal direction. The rod expands longitudinally and contracts radially in the respective region influenced by the magnetic field causing the rod to be released from the pressure of the stator tube and performing a step-like motion in the longitudinal direction. Magnetostrictive rods are also described with several short sections in series.

A prestress, beyond the provision or secure clamping, has other effects. It does not only eliminate the influence of mechanical hysteresis in the direction of expansion of the magnetostrictive body referred to on page 3, lines 20 pp in the above cited SE-patent application. It also causes a reorientation of the grains of the magnetostrictive material and leads to an enhancement of the longitudinal expansion and consequently, the radial contraction. The amount of the prestress influences the extent of this effect within certain limits. A prestress in the direction of contraction enhances this effect. Therefore, it is very important to keep the prestress within the predetermined limit so as to achieve the desired performance of the linear motor.

Various problems are inherent in the latter linear motor. Even if the motion in the longitudinal direction of such a rod substantially takes place only after the magnetostrictive rod is released from the inner surface of the stator tube wear and tear still occurs. This leads to a change in the dimensions of both the rod and stator tube and thus a pressure exerted by the stator tube onto the rod and the radial prestress in the magnetostrictive rod. In the extreme this wear can lead to such a change in the diameter conditions that the stator tube no longer securely clamps the non-contracted portion of the magnetostrictive rod and thus the basis for a defined advancement of the rod relative to the stator tube is lost. Since the predetermined radial pressure is unadjustable, then it is not possible in this actuator to compensate for wear or any change in load. Also, the only way to adjust the predetermined radial pressure is to change the tolerance between the stator tube and the rod which is very difficult. Furthermore, in the same linear motor, both the magnetostrictive body and the stator tube have to be machined to narrow tolerances, so as to generate the desired press fit. This makes the fabrication of the two bodies complicated and expensive and the linear motor becomes very sensitive to wear between the two bodies.

Therefore, the object of this invention consists in developing a method or respectively an elastic clamping device for at least one body with magnetostrictive properties facilitating release of the contracting body, causing a prestress therein in the direction of the contraction and making this predetermined pressure causing this prestress, adjustable.

SUMMARY OF THE INVENTION

According to the invention this object is achieved in that the pressure force in a clamping device according to the species of claim 1, which is applied along the whole length of the magnetostrictive body, extends in the direction of contraction and perpendicular to the direction of expansion both being caused by the influence of a magnetic field on the magnetostrictive body and causing a prestress acting in the direction of contraction within the magnetostrictive body, and in that the predetermined pressure from the pressure means acting on the clamping device and thus on the magnetostrictive body is adjustable by means of a resilient force or a mechanical setting means, and respectively a method being designed such that the pressure force is applied along the whole length of the magnetostrictive body perpendicular to the expansion of the magnetostrictive body and causing therein a prestress acting in the direction of contraction and in that the predetermined pressure from the pressure device exerted onto the clamping device and thus onto the magnetostrictive body is adjustable by means of a resilient force or mechanical means.

The device and the method, respectively, according to the invention have the advantage that the prestress is caused in the direction of contraction in which the magnetostrictive body is supposed to lift off from the clamping device, and in that the clamping device can be fabricated with simple means and without complicated design. The uncomplicated design allows the arrangement of magnetic coils a small distance around the device, thus making high efficiencies achievable.

Due to the adjustability, the embodiment according to the invention permits simple fabrication of the individual parts, as they do not have to be fabricated to such narrow tolerances and precise fits as would be the case in an arrangement without adjustability. It is also convenient that the pressure force and the prestress can be readjusted by means of the setting means, for example, in order to be able to compensate for wear and that they could be adapted to the requirement and the dimension of the stepping motor.

Magnetrostrictive bodies may for example be fabricated with cornered or resulting from the contraction coefficient and the dimension of the body in the direction of contraction can thus be maximized in one direction. If, in accordance with one of the subclaims, the magnetostrictive body is formed with different contraction in different cross-sectional directions, clamping and the prestressing in the direction of greatest contraction facilitate the release.

Further convenient embodiments result from the subclaims.

The subsequent embodiments of the device according to the invention are explained in more detail in the drawings.

FIG. 3 shows cross-sectional views of the embodiment of FIG. 2.

Figure 5D:
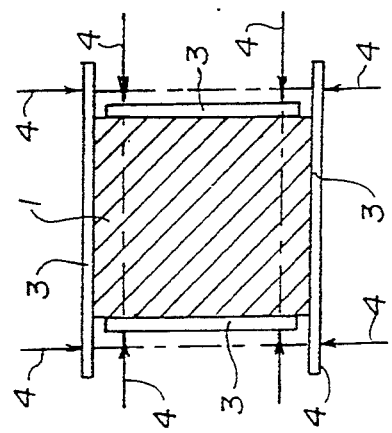
FIG. 5a shows a magnetostrictive body 1 with round cross-section which may for example consist of several shorter sections arranged in series, which sections are prestressed in the longitudinal direction and which body may be held under stress by a slotted tubular clamping device.
Figure 5C:
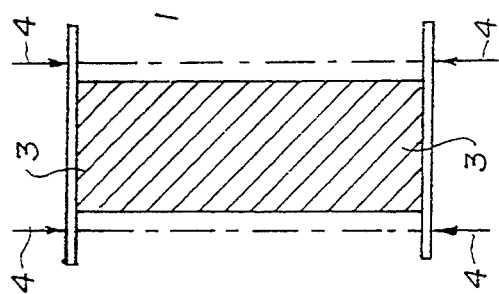
Figure 5B:
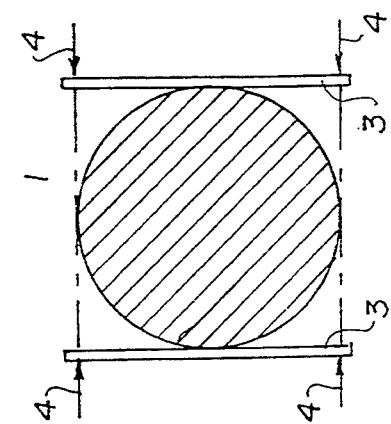
Figure 5A:
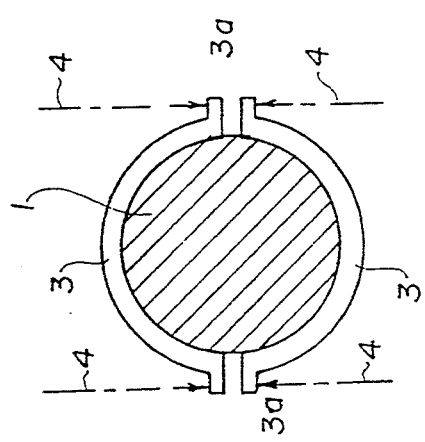
Figure 5A:
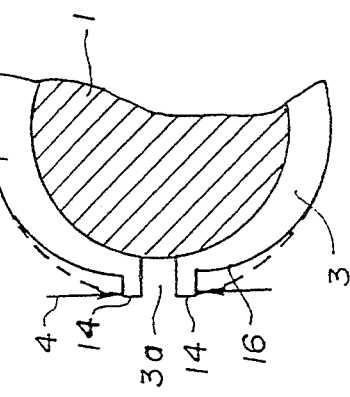

FIG. 5aa shows a section from FIG. 5a.

FIG. 5b shows a round body clamped in a clamping device having the shape of opposite parallel plates with force applied to the plates.

FIG. 5c shows a body with rectangular cross-section clamped between two parallel plates across the longest dimension of the body in the direction of its maximum contraction.

FIG. 5d shows a magnetostrictive body, for example, with square cross-section clamped between two parallel pairs of plates with the pairs being perpendicular to each other.

Figure 1A:
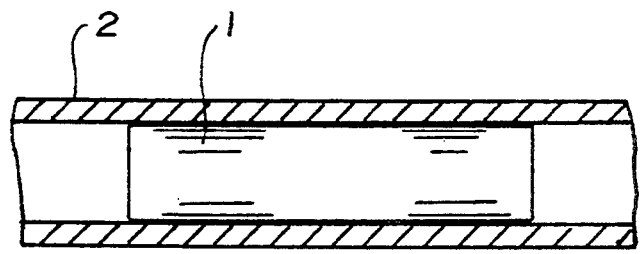
FIG. 1a shows the advancement element held within a press tube.
Figure 1B:
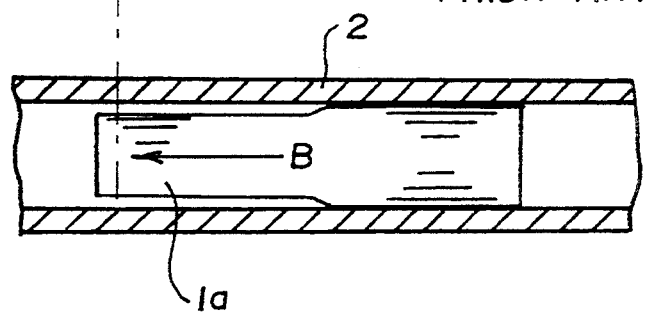
FIG. 1b shows the advancement element partially loose within the press tube; the advancement element 1a partially loose within press tube 2. By means of control in a magnetic field B 1a has become longer and thinner.

Referring to FIGURE 1a there is shown, according to known techniques of fabricating magnetostrictive motors, a magnetostrictive advancement element 1 which has been press fit into a press tube 2. FIG. 1b shows the advancement element 1a partially loose within the press tube due to the application of a magnetic field B which has made a portion of the advancement element longer and thinner. In order to achieve the desired clamping pressure and at the same time minimize wear due to magnetization and movement of the advancement element 1 narrow tolerances must be met. Moreover, no method of adjusting for wear is available for such techniques.

Figure 2:
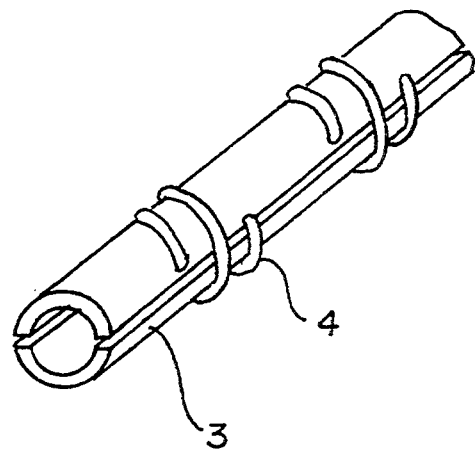
FIG. 2 shows a perspective view of an embodiment of the invention.

Referring to FIG. 2 there is shown a clamping device 3 provided with slits and pressure means 4 formed as a plurality of spaced apart springs used to radially prestress the advancement element (not shown) contained within the device 3. The springs could be replaced by clamps, a tongue with bolt elements, a resilient ring or the like.

Figure 3A:
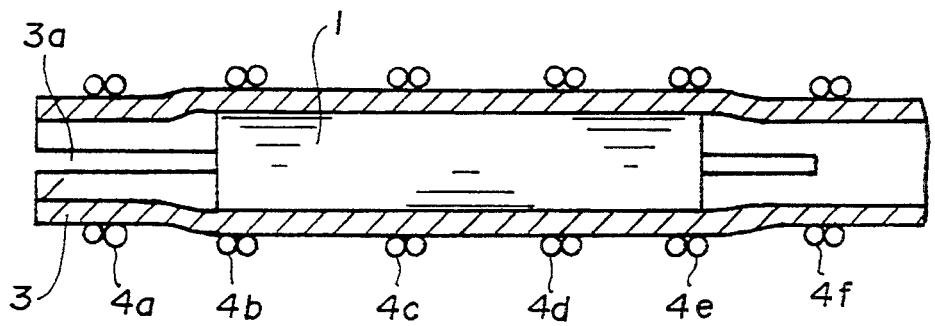
FIG. 3a shows the magnetostrictive body in the clamping device.

Referring to FIG. 3a, the clamping device 3 is provided with a slit 3a which allows for tolerances in diameter of the magnetostrictive body 1 and the clamping device 3. Springs 4a to 4f radially press the slotted clamping device 3 and achieve the prestress between the clamping device 3 and the magnetostrictive body 1.

Figure 3B:
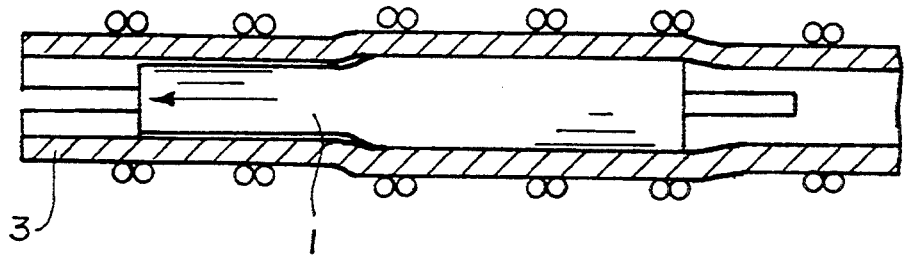
FIG. 3b shows this system in the activated state.

FIG. 3b shows the system of FIG. 3a in the activated state in which a magnetic field B partially changes the geometry of the magnetostrictive body 1. As the stiffness of the clamping device 3 is greater than the decrease in diameter of body 1, body 1 is released from clamping device 3. However, the remaining length of the body 1 not in the presence of magnetic field B continues to be fixed under radial prestress in the clamping device. 3.

Figure 4:
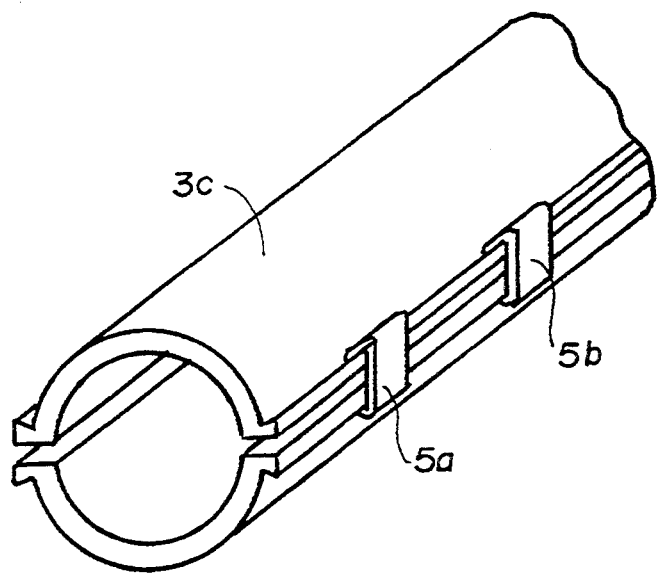
FIG. 4 shows an alternative embodiment according to the invention for achieving the prestress of the clamping device in the shape of a prestress tube.

Referring to FIG. 4, there is shown a prestress tube 3c having longitudinal slits and lugs extending along the outer portion of the slits. Clamps 5a, 5b, etc. over the lugs elastically draw together the slits. The lugs could be replaced with screws to enable adjustment and readjustment of the pressure.

Referring to FIG. 5a there is shown a magnetostrictive body 1 with round cross-section which may consist of several shorter sections arranged in series. The sections are prestressed longitudinally along the axis of the sections by elements which are not shown to keep them in tight contact, and are held under stress radially. In the region of the slits 3a the tube is tangentially flattened so that the end of the protrusions 14 bounding the slits 3a touch the dotted outline 16 which is the extension of the circle coincident with the surface of the tube 3 between the slits 3a. Pressure means 4 is applied in the space formed within the dotted outline 16 exterior to the tube 3 against the protrusions 14 and is distributed uniformly and radially over the advancement element 1 by the tube 3. This may be accomplished by removing the material of the tube as shown between the dotted outline in FIG. 5aa and the exterior of the tube 3 so as to leave the protrusions 14 bounding slits 3a. The tube 3 can, thus, be encircled by round magnetic coils (not shown) with very small gap widths leading to very good efficiencies. By keeping the prestress within a predetermined limit it is possible to achieve a desired performance of a linear motor utilizing such an arrangement.

Referring to FIG. 5b the round body 1 is clamped between parallel plates 3 with pressure means 4 applied against the plates 3 at either side of each plate. Body 1 could also have an oval cross-section and be clamped across its longer diameter by plates 3. The maximum contraction then occurs in the direction perpendicular to the plates 3. The resilient force of the plates and the lever arm between the clamping region and the point of attack of the force can be used for optimizing the clamping.

Referring to FIG. 5c the body 1 has a rectangular cross-section and is clamped between two parallel plates 3 across its longer dimension in the direction of its maximum contraction.

Referring to FIG. 5d the body 1 has square cross-section and is clamped between two parallel pairs of plates 3 with the pairs being perpendicular to each other. At one pair of plates 3, the pressure means 4 acts on the plates as in FIG. 5c, while at the other the pressure means 4 acts on the portion of the plates protruding beyond the body 1.

I claim:

1. An elastic clamping device for at least one body with magnetostrictive properties, wherein a pressure means presses said clamping device against an interior magnetostrictive body with a predetermined pressure at zero applied magnetic filed along the length of said magnetostrictive body, characterized in that, the pressure means is applied to the magnetostrictive body producing a pressure which extends in the direction of contraction along the whole length of the rod and perpendicular to the direction of the expansion caused under the influence of a magnetic field on said magnetostrictive body, and wherein the predetermined pressure exerted by the pressure means on said magnetostrictive body is adjustable by means of a resilient force or mechanical setting means so as to adjust the pressure to the desired value.

2. A clamping device according to claim 1, characterized in that the predetermined pressure acting on said magnetostrictive body can be adjusted so as to compensate for any variation in this pressure.

3. A clamping device according to claim 1, characterized in that said magnetostrictive body has a round cross-section and said elastic clamping device is pressed radially inward towards said magnetostrictive body by said pressure means.

4. A clamping device according to claim 3, characterized by having a tube with at least one longitudinal slit.

5. A clamping device according to claim 1, characterized by said magnetostrictive body having a rectangular cross-section, said elastic clamping device comprising at least one pair of plates each being pressed against opposite sides of said magnetostrictive body, and said pressure means pressing opposite plates onto each other.

6. A clamping device according to claim 1, characterized in that said prestress is caused in the direction of greatest contraction.

7. A clamping device according to any one of the preceding claims, characterized by said clamping device having such an elasticity in the longitudinal direction that the pressure on said magnetostrictive body developed by said pressure means over longitudinal segments contracting under the influence of a magnetic field lift from the inner surface of the elastic clamping device.

8. A method for clamping at least one body with magnetostrictive properties by means of a pressure means exerted onto an elastic clamping device and pressing it against an inner magnetostrictive rod with a predetermined force, characterized by the pressure developed by said clamping means extending in the direction of a contraction and perpendicular to the expansion of the magnetostrictive body and causing it in a prestress at zero applied magnetic field acting in the direction of a contraction, and said pressure acting on the magnetostrictive body can be adjusted by means of a resilient force or mechanical means.

* * * * *